US012787602B2

(12) United States Patent
Cho

(10) Patent No.: US 12,787,602 B2
(45) Date of Patent: Nov. 3, 2026

(54) WINDOW AND DISPLAY DEVICE INCLUDING THE SAME

(71) Applicant: Samsung Display Co., Ltd., Yongin-si (KR)

(72) Inventor: Jonghwan Cho, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 416 days.

(21) Appl. No.: 18/120,543

(22) Filed: Mar. 13, 2023

(65) Prior Publication Data

US 2023/0292576 A1 Sep. 14, 2023

(30) Foreign Application Priority Data

Mar. 14, 2022 (KR) ........................ 10-2022-0031189
Jul. 19, 2022 (KR) ........................ 10-2022-0088803

(51) Int. Cl.
*H10K 59/80* (2023.01)
*H10K 59/38* (2023.01)
*H10K 59/40* (2023.01)

(52) U.S. Cl.
CPC ........... *H10K 59/872* (2023.02); *H10K 59/38* (2023.02); *H10K 59/40* (2023.02); *H10K 59/873* (2023.02); *H10K 59/8791* (2023.02); *H10K 59/8792* (2023.02)

(58) Field of Classification Search
CPC ...... H10K 59/872; H10K 59/38; H10K 59/40; H10K 59/873; H10K 59/8791; H10K 59/8792; H10K 59/131; H10K 59/121; H10K 77/10; H10K 1/133331
See application file for complete search history.

(56) References Cited

U.S. PATENT DOCUMENTS 5,106,671 A * 4/1992 Amberger ......... B32B 17/10036 428/428
5,407,733 A * 4/1995 Bjornard ................ G02B 1/116 359/359
5,411,794 A * 5/1995 Kawaguchi ......... C03C 17/3441 428/428
6,165,598 A * 12/2000 Nelson ................ C03C 17/3452 359/359

(Continued)

FOREIGN PATENT DOCUMENTS

CN 113064225 A * 7/2021 ............. C23C 14/10
JP 6561823 8/2019

(Continued)

*Primary Examiner* — Ida M Soward
(74) *Attorney, Agent, or Firm* — Lerner David LLP

(57) ABSTRACT

A display device with a window where the window has low reflectance and excellent mechanical strength. The window has multiple layers. One layer includes silica ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof; and the layer has a refractive index in a range of about 1.3 to about 1.6 at a wavelength of about 550 nm.

18 Claims, 6 Drawing Sheets

(56) References Cited

U.S. PATENT DOCUMENTS

| | | | | |
|---|---|---|---|---|
| 6,478,932 | B1 * | 11/2002 | Chu | C03C 17/36 427/166 |
| 6,858,306 | B1 * | 2/2005 | Strickler | C03C 17/002 359/359 |
| 9,079,802 | B2 | 7/2015 | Bellman et al. | |
| 9,720,141 | B1 * | 8/2017 | Cheng | G02B 1/115 |
| 10,822,271 | B2 | 11/2020 | Adib et al. | |
| 11,043,656 | B2 | 6/2021 | Lee | |
| 11,586,201 | B2 * | 2/2023 | Zhong | G01C 21/1656 |
| 11,713,503 | B2 * | 8/2023 | Cheah | C23C 14/221 252/582 |
| 11,900,713 | B2 | 2/2024 | Ryu et al. | |
| 2008/0072956 | A1 * | 3/2008 | Sharma | C03C 17/22 136/256 |
| 2011/0168261 | A1 * | 7/2011 | Welser | G02B 1/115 257/E31.127 |
| 2012/0009388 | A1 * | 1/2012 | Varaprasad | C03C 17/42 427/226 |
| 2012/0019915 | A1 * | 1/2012 | Yan | C08J 7/043 427/164 |
| 2012/0224256 | A1 * | 9/2012 | Dasbach | F24S 70/30 359/350 |
| 2014/0147654 | A1 | 5/2014 | Walther et al. | |
| 2014/0220327 | A1 * | 8/2014 | Adib | C03C 17/3435 428/217 |
| 2015/0243855 | A1 * | 8/2015 | Wilm | H10H 20/841 257/98 |
| 2016/0003998 | A1 * | 1/2016 | Benoit | G02B 6/0031 362/330 |
| 2017/0102601 | A1 * | 4/2017 | Luten | E06B 3/6715 |
| 2017/0129806 | A1 | 5/2017 | Fujii et al. | |
| 2017/0146709 | A1 | 5/2017 | O'Ryan | |
| 2017/0233287 | A1 | 8/2017 | Li et al. | |
| 2018/0127304 | A1 * | 5/2018 | Gross | C03C 21/002 |
| 2019/0079236 | A1 * | 3/2019 | Hung | G02B 5/3083 |
| 2019/0285775 | A1 | 9/2019 | Zieba et al. | |
| 2020/0002551 | A1 | 1/2020 | Mitsuhashi et al. | |
| 2020/0200947 | A1 * | 6/2020 | Ngo | C03C 17/3417 |
| 2020/0400974 | A1 * | 12/2020 | De Ayguavives | G02C 7/02 |
| 2021/0033751 | A1 | 2/2021 | Hart et al. | |
| 2021/0033846 | A1 * | 2/2021 | Ouyang | B82Y 20/00 |
| 2021/0047236 | A1 | 2/2021 | Adib et al. | |
| 2021/0087105 | A1 * | 3/2021 | Bellman | C03C 17/009 |
| 2021/0129495 | A1 * | 5/2021 | Asai | B32B 17/10036 |
| 2021/0178730 | A1 | 6/2021 | Baby et al. | |
| 2025/0048830 | A1 * | 2/2025 | Ahn | H10K 50/865 |

FOREIGN PATENT DOCUMENTS

| | | | | | |
|---|---|---|---|---|---|
| JP | 6843743 | | | 3/2021 | |
| KR | 10-2013-0059020 | | | 6/2013 | |
| KR | 10-2016-0117627 | | | 10/2016 | |
| KR | 10-1889667 | | | 8/2018 | |
| KR | 20190056475 | A | * | 5/2019 | G02B 5/283 |
| KR | 10-2020-0004369 | | | 1/2020 | |
| KR | 10-2020-0091484 | | | 7/2020 | |
| KR | 20200101552 | A | | 8/2020 | |
| KR | 10-2245007 | | | 4/2021 | |
| KR | 10-2021-0049838 | | | 5/2021 | |
| KR | 10-2021-0089693 | | | 7/2021 | |
| KR | 10-2290498 | | | 8/2021 | |
| KR | 10-2021-0107605 | | | 9/2021 | |
| KR | 10-2021-0116446 | | | 9/2021 | |
| KR | 20220027355 | A | | 3/2022 | |

* cited by examiner

WINDOW AND DISPLAY DEVICE INCLUDING THE SAME

CROSS-REFERENCE TO RELATED APPLICATION(S)

This application claims priority to and benefits of Korean Patent Application Nos. 10-2022-0031189 and 10-2022-0088803, under 35 U.S.C. § 119, filed on Mar. 14, 2022 and Jul. 19, 2022, respectively, in the Korean Intellectual Property Office, the entire contents of which are incorporated herein by reference.

BACKGROUND

1. Technical Field

The disclosure herein relates to a window having low reflectance and excellent mechanical properties and a display device including the same.

2. Description of the Related Art

A display device is used in various multimedia devices such as a television, a mobile phone, a tablet computer, and a game console to provide image information to a user. Recently, various types of flexible display devices which are foldable or bendable have been developed. Flexible display devices may be variously changed in shape, for example, folded, rolled, or bent, and are thus easy to carry.

A flexible display device may include a foldable or bendable display panel and a window. However, the window of the flexible display device is deformed by a folding or bending operation or is likely to be damaged by an external impact.

SUMMARY

The disclosure provides a window having low reflectance and excellent mechanical strength.

The disclosure also provides a display device having low reflectance while improving display efficiency.

An embodiment provides a window that may include a base layer, a first layer disposed on the base layer, a second layer disposed on the first layer, and a third layer disposed on the second layer. The second layer may include silica ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof, and the second layer may have a refractive index in a range of about 1.3 to about 1.6 at a wavelength of about 550 nm.

In an embodiment, the second layer may include silica ($SiO_2$), magnesium oxide (MgO), aluminum oxide ($Al_2O_3$), or any combination thereof.

In an embodiment, the second layer may be disposed directly on the first layer, and the third layer may be disposed directly on the second layer.

In an embodiment, the first layer may include at least one of magnesium fluoride ($MgF_2$), magnesium oxide (MgO), or any combination thereof.

In an embodiment, the first layer may further include yttrium oxyfluoride (YOF).

In an embodiment, the first layer may include a solid solution in which magnesium oxide, magnesium fluoride, and yttrium oxyfluoride are mixed.

In an embodiment, the window may have, at an upper surface of the third layer, a reflectance less than or equal to about 6.5% at a wavelength of about 550 nm.

In an embodiment, the third layer may include a fluorine-containing polymer.

In an embodiment, the first layer may have a refractive index in a range of about 1.3 to about 1.5 at a wavelength of about 550 nm, and the third layer may have a refractive index in a range of about 1.3 to about 1.5 at a wavelength of about 550 nm.

In an embodiment, the base layer may include a glass substrate or a polymer film.

In an embodiment, the first layer may have a thickness in a range of about 50 nm to about 130 nm, the second layer may have a thickness in a range of about 5 nm to about 25 nm, and the third layer may have a thickness in a range of about 5 nm to about 30 nm.

In an embodiment, the window may further include a fourth layer disposed between the base layer and the first layer and including magnesium oxide.

In an embodiment, the window may further include a fifth layer disposed between the base layer and the first layer. The fifth layer may have a refractive index in a range of about 1.7 to about 3.0 at a wavelength of about 550 nm.

In an embodiment, the fifth layer may include zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), oxide tungsten ($WO_3$), aluminum nitride (AlN), or any combination thereof.

In an embodiment, the window may further include a sixth layer disposed below the base layer. The sixth layer may have a refractive index in a range of about 1.3 to about 1.5 at a wavelength of about 550 nm.

In an embodiment, the sixth layer may include magnesium oxide, magnesium fluoride, yttrium oxyfluoride, or any combination thereof.

In an embodiment of the disclosure, a window may include a base layer, a first layer disposed on the base layer, a second layer disposed on the first layer, and a third layer disposed on the second layer. The first layer may include a first material and the second layer may include a second material. The first material and the second material may each independently include silica, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof.

In an embodiment of the disclosure, a display device may include a display module; and a window disposed on the display module. The window may include a base layer, a first layer disposed on the base layer, a second layer disposed on the first layer, and a third layer disposed on the second layer. The second layer may include silica ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof. The second layer may have a refractive index in a range of about 1.3 to about 1.6 at a wavelength of about 550 nm.

In an embodiment, the display module may include a circuit layer disposed on a base substrate, a light-emitting element layer disposed on the circuit layer, an encapsulation layer disposed on the light-emitting element layer, and an anti-reflection layer disposed on the encapsulation layer. The anti-reflection layer may include a division layer including multiple division openings respectively overlapping multiple light-emitting elements in a thickness direction of the base substrate, and multiple color filters disposed to respectively correspond to the division openings.

In an embodiment, the base layer may be disposed between the first layer and the display module.

In an embodiment, an upper surface of the third layer may define an outermost surface of the window.

In an embodiment, the sum of the thicknesses of the first layer, the second layer, and the third layer may be less than or equal to about 150 nm.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1A:
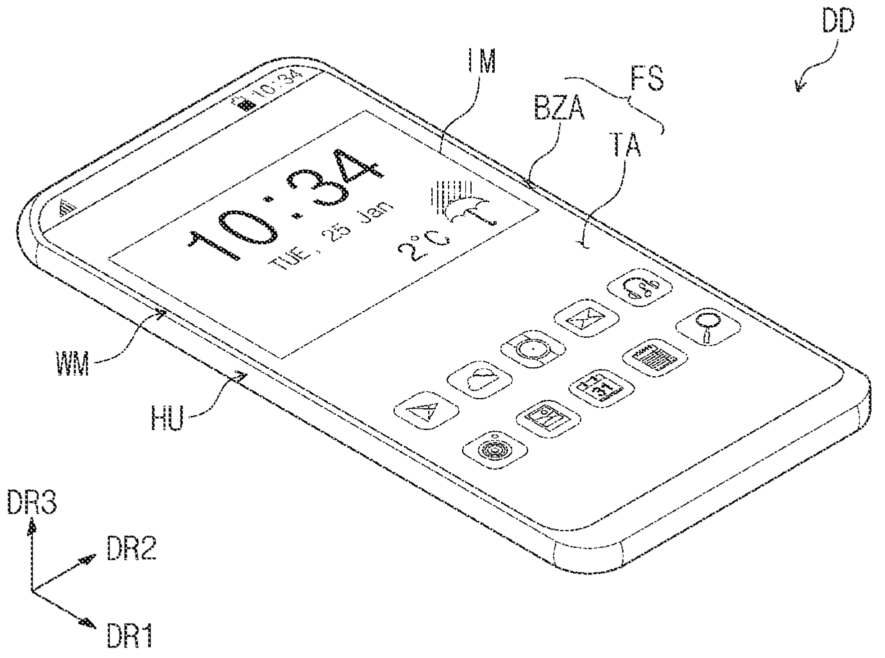
FIG. 1A is a perspective view of a display device according to an embodiment.

It will be understood that when an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Like numbers or symbols refer to like elements throughout. Also, in the drawings, the thicknesses, ratios, and dimensions of the elements are exaggerated for effective description of the technical contents. The term "and/or" includes all of one or more combinations which can be defined by related elements.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the disclosure. The singular forms include the plural forms as well, unless the context clearly indicates otherwise.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

In this application, "directly disposed" means that there is no additional layer, film, region, plate, or the like added between the portion of the layer, film, region. For example, "directly disposed" may mean disposing without additional members such as adhesive members between two layers or two members.

Unless otherwise defined, all terms (including technical and scientific terms) used herein have the same meaning as commonly understood by one of ordinary skill in the art to which the disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, embodiments of the disclosure will be described with reference to the drawings.

Figure 1B:
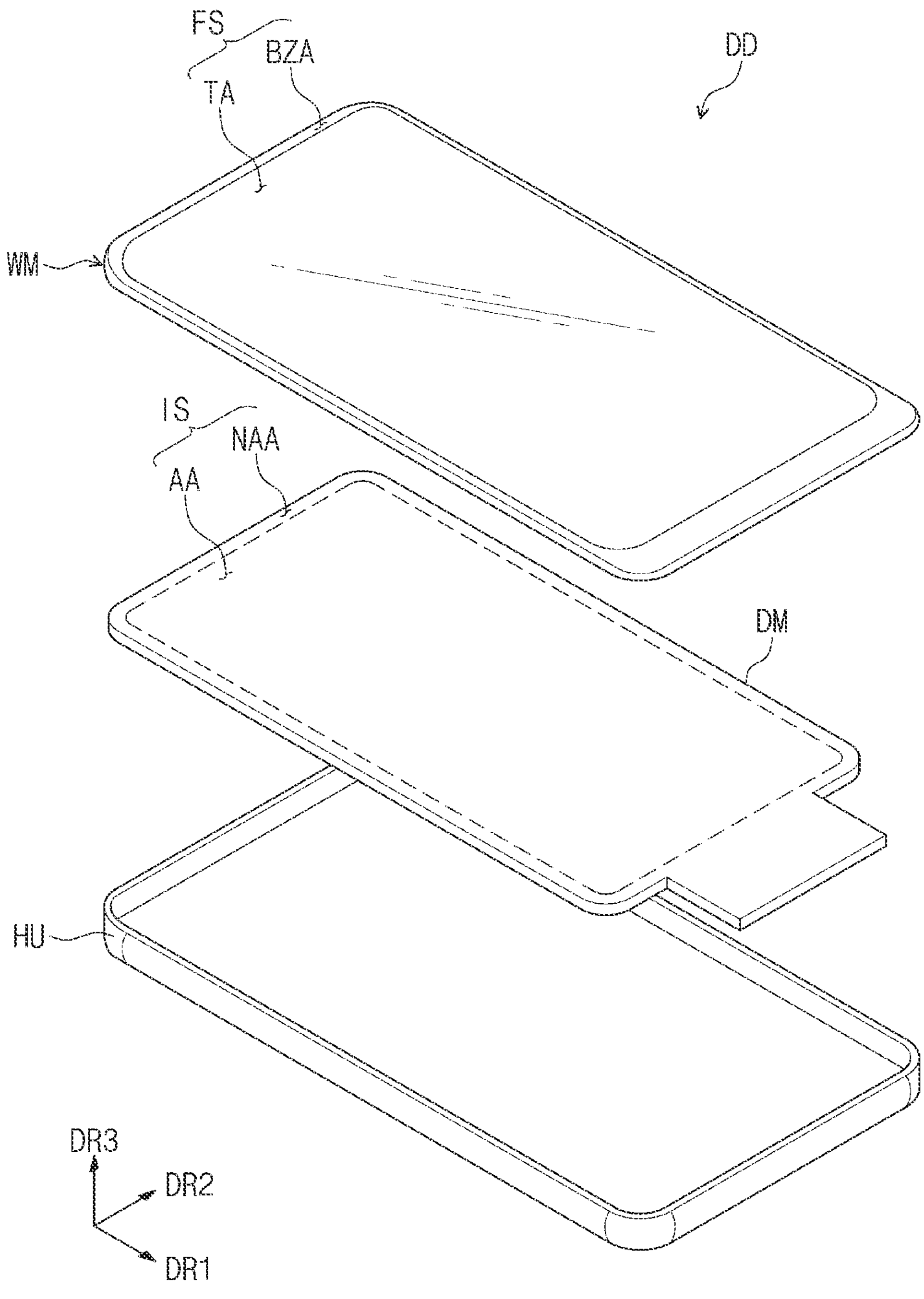
FIG. 1B is an exploded perspective view of a display device according to an embodiment.

FIG. 1A is a perspective view of a display device according to an embodiment of the disclosure. FIG. 1B is an exploded perspective view of a display device according to an embodiment of the disclosure.

Referring to FIG. 1A, a display device DD may be a device activated in response to an electrical signal. The display device DD may display an image IM and sense an external input. The display device DD may include various embodiments. For example, the display device DD may include a tablet, a laptop, a computer, a smart television, or the like. In this embodiment, the display device DD is illustratively shown as a smart phone.

The display device DD may display an image IM, in a third direction DR3, on a display surface FS that is parallel to each of a first direction DR1 and a second direction DR2. The display surface FS, on which an image IM is displayed, may correspond to a front surface of the display device DD and may also correspond to a front surface of a window WM. Hereinafter, the same reference symbol is used to denote the display surface, front surface of the display device DD, and the front surface of the window WM. The image IM may include static images as well as dynamic images. In FIG. 1A, a clock and multiple icons are illustrated as examples of the image IM.

In this embodiment, a front surface (or a top surface) and a rear surface (or a bottom surface) for each member may be defined based on the direction in which an image IM is displayed. The front and rear surfaces may be opposed to each other in the third direction DR3, and the normal direction of each of the front and rear surfaces may be parallel to the third direction DR3. A distance between the front and rear surfaces in the third direction DR3 may correspond to a thickness of the display device DD in the third direction DR3. Here, directions indicated by the first to third directions DR1, DR2, and DR3 may have a relative concept and may thus be changed to other directions. Hereinafter, the first to third directions may be the directions respectively indicated by the first to third directions DR1, DR2, and DR3, and may thus be denoted as the same reference numerals or symbols. In the specification, the wording "in a plan view" may indicate viewing in the third direction DR3.

The display device DD according to an embodiment of the disclosure may sense a user's input applied from the outside. For example, the user's input may include various types of external inputs such as a portion of the user's body, light, heat, or pressure. The user's input may be provided in various forms. Also, the display device DD may sense the user's input applied to a side surface or a rear surface of the display device DD according to a structure of the display device DD, but is not limited to any one embodiment.

As illustrated in FIGS. 1A and 1B, the display device DD may include a window WM, a display module DM, and an outer case HU. In this embodiment, the window WM and an outer case HU may be coupled to form an exterior of the display device DD. In this embodiment, the outer case HU, the display module DM, and the window WM may be sequentially stacked in the third direction DR3.

The window WM may include an optically transparent material. The window WM may include an insulating material. For example, the window WM may be composed of glass, plastic, or a combination thereof.

As described above, the front surface FS of the window WM may define the front surface of the display device DD. A transmission region TA may be an optically transparent region. For example, the transmission region TA may be a region having a visible light transmittance of greater than or equal to about 90%.

A bezel region BZA may be a region having a relatively lower light transmittance than the transmission region TA. The bezel region BZA may define the shape of the transmission region TA. The bezel region BZA may be disposed adjacent to the transmission region TA and may surround the transmission region TA.

The bezel region BZA may have a predetermined (or selectable) color. The bezel region BZA may cover a peripheral region NAA of the display module DM to prevent the peripheral region NAA from being viewed from the outside. However, the disclosure is not limited thereto. The bezel region BZA may be omitted in the window WM according to an embodiment of the disclosure.

The display module DM may display an image IM and sense an external input. An image IM may be displayed on the front surface IS of the display module DM. The front surface IS of the display module DM may include an active region AA and a peripheral region NAA. The active region AA may be a region to be activated in response to an electrical signal.

In this embodiment, the active region AA may be a region in which an image IM is displayed, and may also be a region in which an external input is sensed. The transmission region TA may overlap at least at least a portion of the active region AA in the third direction DR3. For example, the transmission region TA may overlap a front surface or at least a portion of the active region AA in the third direction DR3. Accordingly, a user may view an image IM and provide an external input through the transmission region TA. However, this is merely an example. In the active region AA, a region in which an image IM is displayed and a region in which an external input is sensed may be separated from each other, and the active region AA is not limited to one embodiment.

The peripheral region NAA may be a region covered by the bezel region BZA. The peripheral region NAA may be disposed adjacent to the active region AA. The peripheral region NAA may surround the active region AA. A driving circuit, a driving line, or the like for driving the active region AA may be disposed in the peripheral region NAA.

The display module DM may include a display panel and a sensor layer. An image IM may be substantially displayed on the display panel, and an external input may be substantially sensed by the sensor layer. Since the display module DM includes both the display panel and the sensor layer, the display module DM may display an image IM and simultaneously sense an external input. This will be described in detail later.

The display device DD according to an embodiment may further include a driving circuit. The driving circuit may include a flexible circuit board and a main circuit board. The flexible circuit board may be electrically connected to the display module DM. The flexible circuit board may connect the display module DM and the main circuit board. However, this is merely an example, and the flexible circuit board according to an embodiment of the disclosure may not be connected to the main circuit board, and the flexible circuit board may be a rigid board.

The flexible circuit board may be connected to pads of the display module DM disposed in the peripheral region NAA. The flexible circuit board may provide an electrical signal for driving the display module DM to the display module DM. The electrical signal may be generated from the flexible circuit board or generated from the main circuit board. The main circuit board may include various driving circuits for driving the display module DM or connectors for supplying power. The main circuit board may be connected to the display module DM through the flexible circuit board.

Although FIG. 1B illustrates an unfolded state of the display module DM, at least a portion of the display module DM may be bent. In this embodiment, a portion of the display module DM may be bent toward a rear surface of the display module DM, and the portion bent toward the rear surface may be a portion to which the main circuit board is connected. Accordingly, the main circuit board may be assembled while overlapping the rear surface of the display module DM.

The outer case HU may be coupled to the window WM to define the exterior of the display device DD. The outer case HU may provide an inner space. The display module DM may be arranged in the inner space.

The outer case HU may include a material having a relatively high rigidity. For example, the outer case HU may include glass, plastic, or metal, or may include multiple frames and/or plates composed of a combination thereof. The outer case HU may stably protect components of the display device DD, which are arranged in the inner space, from external impacts.

Figure 2:
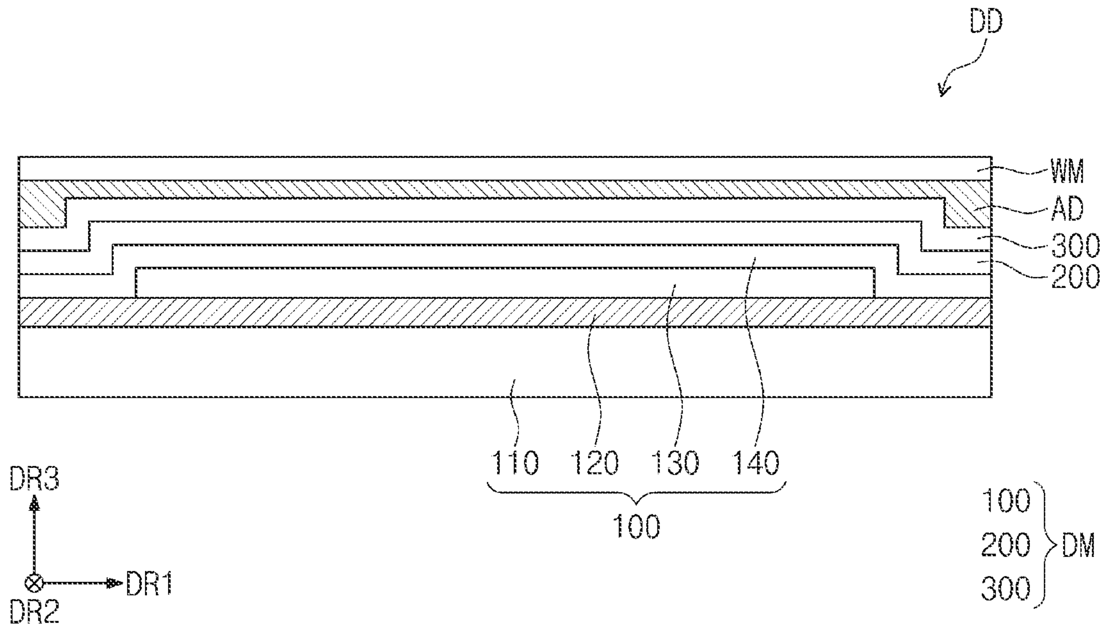
FIG. 2 is a schematic cross-sectional view of a display device according to an embodiment.

FIG. 2 is a schematic cross-sectional view of a display device according to an embodiment of the disclosure.

Referring to FIG. 2, the display device DD may include a display module DM and a window WM. The display module DM and the window WM may be bonded by an adhesive layer AD. In the display device DD according to an embodiment, the display module DM may include a display panel 100, a sensor layer 200, and an anti-reflection layer 300. Among the layers included in the display module DM, the anti-reflection layer 300 may be bonded to the window WM through the adhesive layer AD.

The display panel 100 may be a component that generates an image. The display panel 100 may be a light-emitting display panel. For example, the display panel 100 may be an organic light-emitting display panel, an inorganic light-emitting display panel, a micro LED display panel, or a nano LED display panel. The display panel 100 may also be referred to as a display layer.

The display panel 100 may include a base substrate 110, a circuit layer 120, a light-emitting element layer 130, and an encapsulation layer 140.

The base substrate 110 may be a member that provides a base surface on which the circuit layer 120 is disposed. The base substrate 110 may be a rigid substrate or a flexible substrate capable of bending, folding, rolling, or the like. The base substrate 110 may be a glass substrate, a metal substrate, or a polymer substrate. However, an embodiment of the disclosure is not limited thereto, and the base substrate 110 may include an inorganic layer, an organic layer, or a composite material layer.

The base substrate 110 may have a multi-layered structure. For example, the base substrate 110 may include a first synthetic resin layer, a multi- or single-layered inorganic layer, and a second synthetic resin layer disposed on the multi- or single-layered inorganic layer. Each of the first and second synthetic resin layers may include a polyimide-based resin, but the disclosure is not particularly limited.

The circuit layer 120 may be disposed on the base substrate 110. The circuit layer 120 may include an insulating layer, a semiconductor pattern, a conductive pattern, a signal line, and the like.

The light-emitting element layer 130 may be disposed on the circuit layer 120. The light-emitting element layer 130 may include a light-emitting element. For example, the light-emitting element may include an organic light-emitting material, an inorganic light-emitting material, an organic-inorganic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include at least one inorganic layer. The encapsulation layer 140 may include a stacked structure of an inorganic layer, an organic layer, and an inorganic layer.

The sensor layer 200 may be disposed on the display panel 100. The sensor layer 200 may sense an external input applied from the outside. The external input may be a user's input. The user's input may include various types of external inputs such as a portion of the user's body, light, heat, a pen, or pressure.

The sensor layer 200 may be formed on the display panel 100 through a continuous process. The sensor layer 200 may be disposed directly on the display panel 100. The wording, "being disposed directly on" may mean that an intervening third component is not disposed between the sensor layer 200 and the display panel 100. For example, a separate adhesive member may not be disposed between the sensor layer 200 and the display panel 100.

The anti-reflection layer 300 may be disposed directly on the sensor layer 200. The anti-reflection layer 300 may reduce the reflectance of external light which is incident from the outside of the display device DD. The anti-reflection layer 300 may be formed on the sensor layer 200 through a continuous process. The anti-reflection layer 300 may include color filters. The color filters may have a predetermined (or selectable) arrangement. For example, the color filters may be arranged by taking into consideration of emission colors of pixels included in the display panel 100. The anti-reflection layer 300 may further include a black matrix adjacent to the color filters. A detailed description of the anti-reflection layer 300 will be described later.

In an embodiment of the disclosure, the sensor layer 200 may be omitted. The anti-reflection layer 300 may be disposed directly on the display panel 100. In an embodiment of the disclosure, positions of the sensor layer 200 and the anti-reflection layer 300 may be interchanged.

Although not illustrated, in an embodiment of the disclosure, the display device DD may further include an optical layer disposed on the anti-reflection layer 300. For example, the optical layer may be formed on the anti-reflection layer 300 through a continuous process. The optical layer may control the direction of the light incident from the display panel 100 to improve the front luminance of the display device DD. For example, the optical layer may include an organic insulating layer in which openings are defined to respectively correspond to light-emitting regions of pixels included in the display panel 100, and a high refractive layer covering the organic insulating layer and filling the openings. The high refractive layer may have a refractive index higher than that of the organic insulating layer.

The window WM may provide the front surface of the display device DD. The window WM may include a glass film or a synthetic resin film as a base film. The window WM may further include functional layers such as an anti-reflection layer or an anti-fingerprint layer. A description of the functional layers included in the window WM will be described in more detail with reference to FIGS. 4A and 4B. Although not illustrated, the window WM may further include a bezel pattern overlapping the above-described bezel region BZA (see FIG. 1B) in the third direction DR3.

Figure 3:
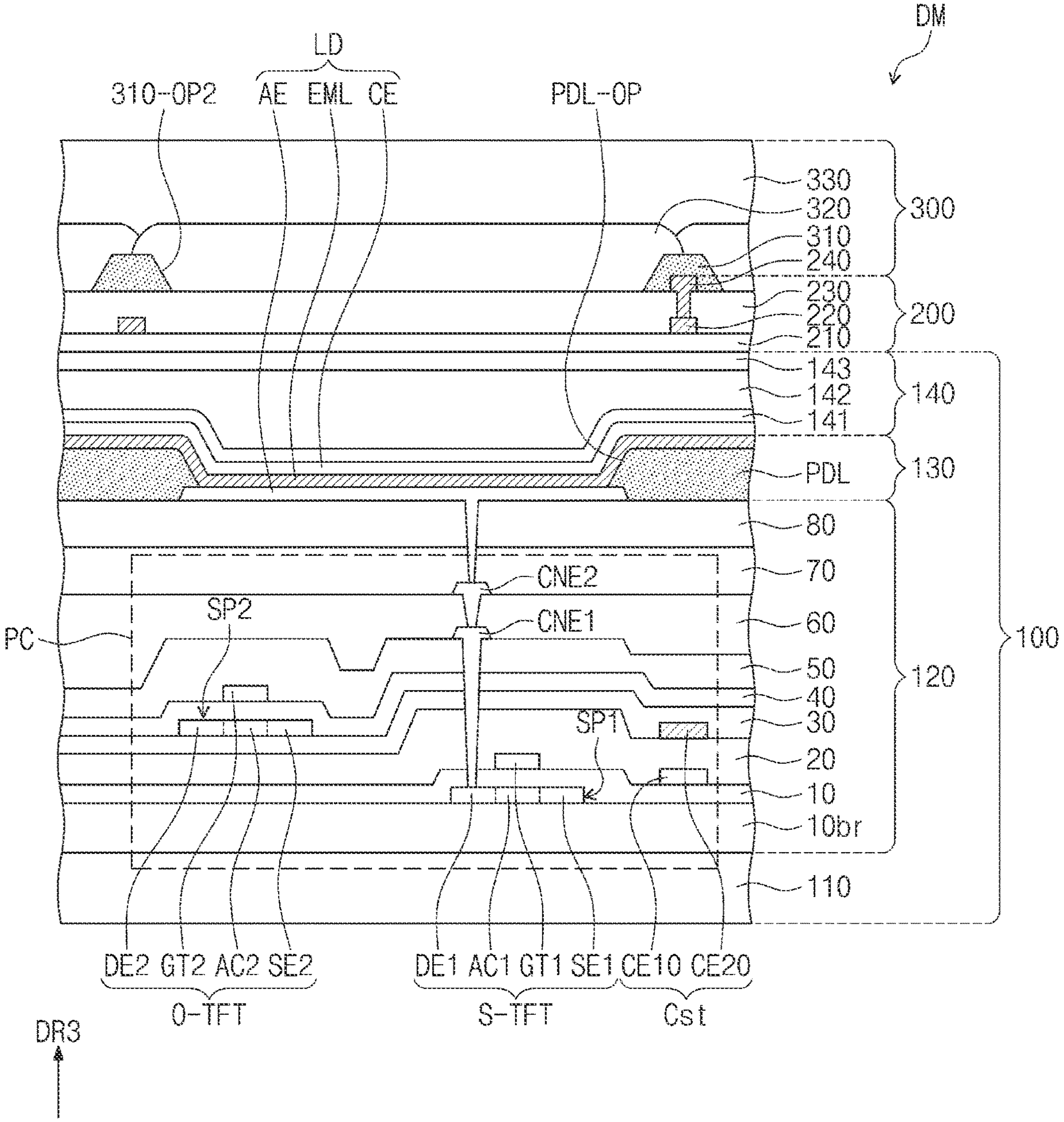
FIG. 3 is a schematic cross-sectional view illustrating a portion of a display module according to an embodiment.

FIG. 3 is a schematic cross-sectional view illustrating a portion of a display module according to an embodiment of the disclosure. FIG. 3 schematically illustrates a partial cross-section of the display module DM including one light-emitting element LD and a pixel circuit PC.

The display panel 100 included in the display module DM according to an embodiment may include a base substrate 110. The base substrate 110 may be a member that provides a base surface on which the circuit layer 120 is disposed. The base substrate 110 may be a glass substrate, a metal substrate, a plastic substrate, or the like. However, an embodiment of the disclosure is not limited thereto, and the base substrate 110 may include an inorganic layer, an organic layer, or a composite material layer.

A buffer layer 10*br* may be disposed on the base substrate 110. The buffer layer 10*br* may prevent metal atoms or impurities from diffusing from the base substrate 110 into the overlying first semiconductor pattern SP1. The first semiconductor pattern SP1 may include an active region AC1 of a silicon transistor S-TFT. The buffer layer 10*br* may control a heat supply rate during the crystallization process for forming the first semiconductor pattern SP1 to allow the first semiconductor pattern SP1 to be uniformly formed.

The first semiconductor pattern SP1 may be disposed on the buffer layer 10*br*. The first semiconductor pattern SP1 may include a silicon semiconductor. For example, the silicon semiconductor may include an amorphous silicon, a polycrystalline silicon, or the like. For example, the first semiconductor pattern SP1 may include a low-temperature polysilicon.

FIG. 3 illustrates only one first semiconductor pattern SP1 disposed on the buffer layer 10*br*, and additional first semiconductor pattern SP1 may be disposed in another region. The first semiconductor pattern SP1 may be arranged according to a specific rule across the pixels. The first semiconductor pattern SP1 may have different electrical properties depending on whether the first semiconductor pattern SP1 is doped or not. The first semiconductor pattern SP1 may include a first region having a high conductivity and a second region having a low conductivity. The first region may be doped with an N-type dopant or a P-type dopant. A P-type transistor may include a doped region which is doped with a P-type dopant, and an N-type transistor may include a doped region which is doped with an N-type dopant. The second region may be a undoped region or a region doped with a lower concentration than that of the first region.

The first region may have a higher conductivity than the second region, and may substantially serve as an electrode or a signal line. The second region may substantially correspond to an active region (or channel) of the transistor. In other words, a portion of the first semiconductor pattern SP1 may be an active region of the transistor, another portion may be a source or drain of the transistor, and still another portion may be a connection electrode or a connection signal line.

A source region SE1 (or a source), an active region AC1 (or a channel), and a drain region DE1 (or a drain) of the silicon transistor S-TFT may be formed in the first semiconductor pattern SP1. The source region SE1 and the drain region DE1 may extend in opposite directions from the active region AC1 in a cross-sectional view.

Although not illustrated, a rear metal layer may be disposed under the silicon transistor S-TFT and under the oxide transistor O-TFT. The rear metal layer may be disposed to overlap the pixel circuit PC in the third direction DR3, and may block external light from reaching the pixel circuit PC. The rear metal layer may be disposed between the base substrate 110 and the buffer layer 10*br*. In another embodiment, the rear metal layer may be disposed between a second insulating layer 20 and a third insulating layer 30. The rear metal layer may include a reflective metal. For example, the rear metal layer may include silver (Ag), Ag-containing alloy, molybdenum (Mo), Mo-containing alloy, aluminum (Al), Al-containing alloy, aluminum nitride (AlN), tungsten (W), tungsten nitride (WN), copper (Cu), and a p+ doped amorphous silicon. The rear metal layer may be connected to an electrode or a wiring, and may receive a constant voltage or a signal therefrom. According to an embodiment of the disclosure, the rear metal layer may be a floating electrode isolated from other electrodes or wiring. In an embodiment of the disclosure, an inorganic barrier layer may be further disposed between the base substrate 110 and the buffer layer 10*br*.

A first insulating layer 10 may be disposed on the buffer layer 10*br*. The first insulating layer 10 may overlap multiple pixels commonly in the third direction DR3 and cover the first semiconductor pattern SP1. The first insulating layer 10 may include an inorganic layer and/or an organic layer and may have a single- or multi-layered structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layered silicon oxide layer. Similar to the first insulating layer 10, the insulating layers of the circuit layer 120 to be described later may also include an inorganic layer and/or an organic layer, and may have a single- or multi-layered structure. The inorganic layers may include at least one of the above-described materials, but is not limited thereto.

A gate GT1 of the silicon transistor S-TFT may be disposed on the first insulating layer 10. The gate GT1 may be a portion of a metal pattern. The gate GT1 may overlap the active region AC1 in the third direction DR3. In the process of doping the first semiconductor pattern SP1, the gate GT1 may function as a mask. The gate GT1 may include titanium (Ti), silver (Ag), Ag-containing alloy, molybdenum (Mo), Mo-containing alloy, aluminum (Al), Al-containing alloy, aluminum nitride (AlN), tungsten (W), tungsten nitride (WN), copper (Cu), indium tin oxide (ITO), indium zinc oxide (IZO), and the like, but an embodiment of the disclosure is not limited thereto.

A second insulating layer 20 may be disposed on the first insulating layer 10 and may cover the gate GT1. A third insulating layer 30 may be disposed on the second insulating layer 20. A second electrode CE20 of a storage capacitor Cst may be disposed between the second insulating layer 20 and the third insulating layer 30. A first electrode CE10 of the storage capacitor Cst may be disposed between the first insulating layer 10 and the second insulating layer 20.

A second semiconductor pattern SP2 may be disposed on the third insulating layer 30. The second semiconductor pattern SP2 may include an active region AC2 of an oxide transistor O-TFT, which will be described later. The second semiconductor pattern SP2 may include an oxide semiconductor. The second semiconductor pattern SP2 may include a transparent conductive oxide (TCO) such as indium tin oxide (ITO), indium zinc oxide (IZO), indium gallium zinc oxide (IGZO), zinc oxide (ZnO), or indium oxide ($In_2O_3$).

The oxide semiconductor may include multiple regions divided according to whether the transparent conductive oxide is reduced or not. A region in which the transparent conductive oxide is reduced (hereinafter, reduced region) may have a greater conductivity than a region in which the transparent conductive oxide is not reduced (hereinafter, non-reduced region). The reduced region may substantially serve as the source/drain or a signal line of the transistor. The non-reduced region may substantially correspond to a semiconductor region (or active region or channel) of the transistor. In other words, a portion of the second semiconductor pattern SP2 may be a semiconductor region of the transistor, another portion thereof may be a source region/drain region of the transistor, and still another portion thereof may be a signal transmission region.

A source region SE2 (or a source), an active region AC2 (or a channel), and a drain region DE2 (or a drain) of the oxide transistor O-TFT may be formed in the second semiconductor pattern SP2. The source region SE2 and the drain region DE2 may extend in opposite directions from the active region AC2 in a cross-sectional view.

A fourth insulating layer 40 may be disposed on the third insulating layer 30. The fourth insulating layer 40 may overlap the pixels commonly in the third direction DR3 and cover the second semiconductor pattern SP2. Although not illustrated, the fourth insulating layer 40 may overlap the gate GT2 of the oxide transistor O-TFT in the third direction DR3 and may be provided in the form of an insulating pattern exposing the source region SE2 and the drain region DE2 of the oxide transistor O-TFT.

The gate GT2 of the oxide transistor O-TFT may be disposed on the fourth insulating layer 40. The gate GT2 of the oxide transistor O-TFT may be a portion of the metal pattern. The gate GT2 of the oxide transistor O-TFT may overlap the active region AC2 in the third direction DR3.

A fifth insulating layer 50 may be disposed on the fourth insulating layer 40 and may cover the gate GT2. A first connection electrode CNE1 may be disposed on the fifth insulating layer 50. The first connection electrode CNE1 may be connected to the drain region DE1 of the silicon transistor S-TFT through a contact hole passing through the first to fifth insulating layers 10, 20, 30, 40, and 50.

A sixth insulating layer 60 may be disposed on the fifth insulating layer 50. The second connection electrode CNE2 may be disposed on the sixth insulating layer 60. The second connection electrode CNE2 may be connected to the first connection electrode CNE1 through a contact hole passing through the sixth insulating layer 60. A seventh insulating layer 70 may be disposed on the sixth insulating layer 60 and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light-emitting element LD may include a first electrode AE (or pixel electrode), a light-emitting layer EML, and a second electrode CE (or common electrode). Each of the light-emitting layer EML and the second electrode CE may be formed in common in the pixels.

The first electrode AE of the light-emitting element LD may be disposed on the eighth insulating layer 80. The first electrode AE of the light-emitting element LD may be a transmissive electrode, a semi-transmissive electrode, or a reflective electrode. According to an embodiment of the disclosure, the first electrode AE of the light-emitting element LD may include a reflection layer formed of Ag, Mg, Al, Pt, Pd, Au, Ni, Nd, Ir, Cr, or a compound thereof and a transparent or translucent electrode layer formed on the reflection layer. The transparent or translucent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum doped zinc oxide (AZO). For example, the first electrode AE of the light-emitting element LD may include a stacked structure of ITO/Ag/ITO.

The pixel defining film PDL may be disposed on the eighth insulating layer 80. The pixel defining film PDL may have a light-absorbing property, and for example, the pixel defining film PDL may have a black color. The pixel defining film PDL may include a black coloring agent. The black coloring agent may include a black dye and a black pigment. The black coloring agent may include carbon black, a metal such as chromium, or an oxide thereof.

The pixel defining film PDL may correspond to a light blocking pattern having light blocking characteristics.

The pixel defining film PDL may cover a portion of the first electrode AE of the light-emitting element LD. For example, an opening PDL-OP that exposes a portion of the first electrode AE of the light-emitting element LD may be defined in the pixel defining film PDL. The pixel defining film PDL may increase a distance between the edge of the first electrode AE of the light-emitting element LD and the second electrode CE. Accordingly, the pixel defining film PDL may serve to prevent an arc from occurring at the edge of the first electrode AE.

Although not illustrated, a hole control layer may be disposed between the first electrode AE and the light-emitting layer EML. The hole control layer may include a hole transport layer and may further include a hole injection layer. An electron control layer may be disposed between the light-emitting layer EML and the second electrode CE. The electron control layer may include an electron transport layer and may further include an electron injection layer. The hole control layer and the electron control layer may be commonly formed in the pixels by using an open mask.

The encapsulation layer 140 may be disposed on the light-emitting element layer 130. The encapsulation layer 140 may include a first inorganic layer 141, an organic layer 142, and a second inorganic layer 143 that are sequentially stacked, but the layers constituting the encapsulation layer 140 are not limited thereto.

The inorganic layers 141 and 143 may protect the light-emitting element layer 130 from moisture and oxygen, and the organic layer 142 may protect the light-emitting element layer 130 from foreign substances such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylic organic layer, but an embodiment of the disclosure is not limited thereto.

The sensor layer 200 may be disposed on the display panel 100. The sensor layer 200 may be a sensor, an input sensing layer, or an input sensing panel. The sensor layer 200 may include a base layer 210, a first conductive layer 220, a sensing insulating layer 230, and a second conductive layer 240.

The base layer 210 may be directly disposed on the display panel 100. The base layer 210 may be an inorganic layer including at least one of silicon nitride, silicon oxynitride, or silicon oxide. In another embodiment, the base layer 210 may be an organic layer including an epoxy resin, an acryl resin, or an imide-based resin. The base layer 210 may have a single-layered structure or a multi-layered structure in which layers are stacked each other in the third direction DR3.

Each of the first conductive layer 220 and the second conductive layer 240 may have a single-layered structure or a multi-layered structure in which layers are stacked each other in the third direction DR3. The first conductive layer 220 and the second conductive layer 240 may include conductive lines that define a mesh-shaped sensing electrode. The conductive lines may not overlap the opening PDL-OP in the third direction DR3 and may overlap the pixel defining film PDL in the third direction DR3.

A single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). The transparent conductive layer may include a conductive polymer such as PEDOT, metal nanowires, graphene, or the like.

A multi-layered conductive layer may include metal layers which are sequentially stacked. The metal layers may have, for example, a three-layer structure of titanium/aluminum/titanium. The multi-layered conductive layer may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include at least one of aluminum oxide, titanium oxide, silicon oxide, silicon nitride, silicon oxynitride, zirconium oxide, and hafnium oxide.

In another embodiment, the sensing insulating layer 230 may include an organic film. The organic film may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The anti-reflection layer 300 may be disposed on the sensor layer 200. The anti-reflection layer 300 may include a division layer 310, multiple color filters 320, and a planarization layer 330.

The anti-reflection layer 300 may reduce the reflectance of external light. The anti-reflection layer 300 may include multiple color filters 320, and the color filters 320 may have a predetermined (or selectable) arrangement. The arrangement of the color filters 320 may be determined by taking into consideration of colors of light emitted from light-emitting element LD included in the display panel 100. In the display module DM according to an embodiment, the anti-reflection layer 300 may not include a retarder or a polarizer, and may reduce the reflectance of the display module DM by the color filters 320. In the display module DM according to an embodiment, the anti-reflection layer 300 may not include a polarizing film or a polarizing layer.

A material constituting the division layer 310 is not particularly limited as long as the material absorbs light. The division layer 310 may have a black color, and in an embodiment of the disclosure, the division layer 310 may include a black coloring agent. The black coloring agent may include a black dye and/or a black pigment. The black coloring agent may include carbon black, a metal such as chromium, or an oxide thereof.

The division layer 310 may cover the second conductive layer 240 of the sensor layer 200. The division layer 310 may prevent reflection of external light by the second conductive layer 240. The division layer 310 may overlap a portion of the pixel defining film PDL.

A division opening 310-OP2 may be defined in the division layer 310. The division opening 310-OP2 may overlap the first electrode AE of the light-emitting element LD in the third direction DR3. One of the color filters 320 may overlap the first electrode AE of the light-emitting element LD in the third direction DR3. One of the color filters 320 may cover the division opening 310-OP2. The color filters 320 may respectively contact the division layer 310.

The planarization layer 330 may cover the division layer 310 and the color filter 320. The planarization layer 330 may include an organic material, and provide a flat surface on the upper surface of the planarization layer 330. In an embodiment of the disclosure, the planarization layer 330 may be omitted.

FIGS. 4A to 4D are each a schematic cross-sectional view of a window according to an embodiment of the disclosure.

Figure 4A:
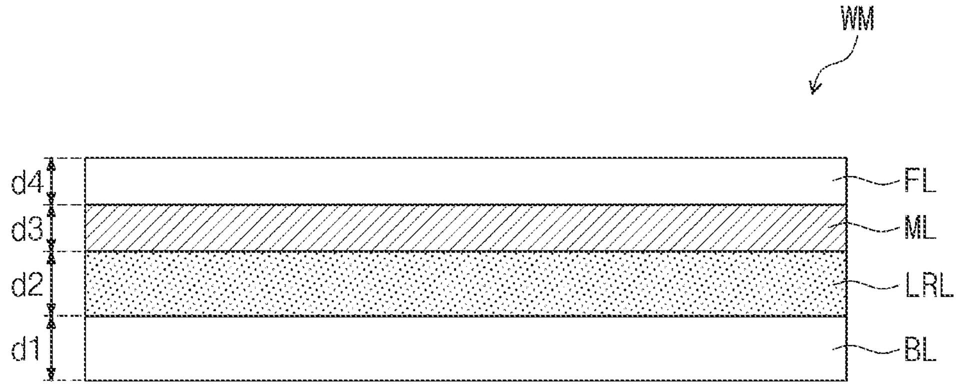
FIG. 4A is a schematic cross-sectional view of a window according to an embodiment.

Referring to FIG. 4A, the window WM according to an embodiment of the disclosure may include a base layer BL, a first layer LRL, a second layer ML, and a third layer FL. In the window WM according to an embodiment, the base layer BL, the first layer LRL, the second layer ML, and the third layer FL may be sequentially stacked.

The base layer BL may include a transparent material. In an embodiment, the base layer BL may include glass, tempered glass, or a polymer film. In an embodiment, the base layer BL may be a chemically strengthened glass substrate. In case that the base layer BL is a chemically strengthened glass substrate, the base layer BL may have a small thickness and high mechanical strength, and thus the window WM may be used as a window of a foldable display device. In case that the base layer BL includes a polymer film, the base layer BL may include a polyimide (PI) film or a polyethylene terephthalate (PET) film. The base layer BL of the window WM may have a multi-layered structure or a single-layered structure. For example, the base layer BL may have a structure in which multiple polymer films are bonded by an adhesive member, or a structure in which a glass substrate and a polymer film are bonded by an adhesive. The base layer BL may be made of a flexible material.

Figure 4B:
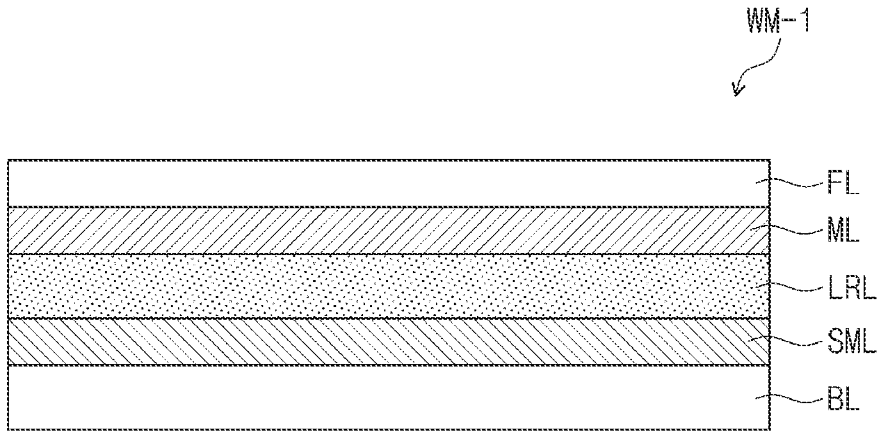
FIG. 4B is a schematic cross-sectional view of a window according to an embodiment.

For example, the base layer BL may have a thickness d1 of about 20 μm to about 60 μm or about 20 μm to about 40 μm. FIGS. 4A and 4B illustrate that the base layer BL has a rectangular shape, but the base layer is not limited thereto. The base layer BL according to an embodiment may have a shape in which an edge of the upper surface of the base layer BL is rounded by a curved surface. For example, the base layer BL may have a shape in which an edge of an upper surface overlapping the bezel region BZA (FIG. 1B) is rounded by a curved surface.

The first layer LRL may be a layer having a lower refractive index than the base layer BL, and may be a layer for lowering the surface reflectance of the window WM. The first layer LRL may be disposed on the base layer BL. The first layer LRL may be directly disposed on the base layer BL. The first layer LRL may be disposed on the base layer BL, and a lower surface of the base layer BL may be a surface adjacent to the above-described display module DM (see FIG. 2). For example, the first layer LRL may be spaced apart from the display module DM with the base layer BL therebetween.

The first layer LRL may include a material having a low refractive index and excellent adhesion to the base layer BL. The first layer LRL may include a first material, and the first material may include a material having a lower refractive index than a material included in the base layer BL. For example, the first material included in the first layer LRL may include silica, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof. For example, the first layer LRL may include at least one of magnesium fluoride ($MgF_2$) and magnesium oxide (MgO).

In an embodiment, the first layer LRL may include magnesium oxide (MgO). The first layer LRL may further include magnesium fluoride ($MgF_2$) and yttrium oxyfluoride (YOF) in addition to magnesium oxide. The first layer LRL may include a solid solution having a structure in which magnesium oxide is included. For example, the first layer LRL may include a solid solution in which magnesium oxide, magnesium fluoride, and yttrium oxyfluoride are mixed. In another embodiment, the first layer LRL may include magnesium fluoride ($MgF_2$). The first layer LRL may be a single layer made of magnesium fluoride ($MgF_2$).

For example, the first layer LRL may have a thickness d2 of about 50 nm to about 130 nm. In case that the first layer LRL has a thickness d2 of less than about 50 nm, the surface reflectance of the window WM may not be sufficiently reduced. In case that the first layer LRL has a thickness d2 greater than about 130 nm, the mechanical strength of the window WM may decrease and thus the durability of the window may be deteriorated, and the total thickness of the window WM may increase to excessively increase the overall thickness of the display device.

The first layer LRL may have a refractive index in a range of about 1.3 to about 1.5 at a wavelength of about 550 nm. In the window WM according to an embodiment, the first layer LRL may have a refractive index in a range of about 1.38 to about 1.40 at a wavelength of about 550 nm. In case that the refractive index of the first layer LRL at a wavelength of about 550 nm satisfies the above range, the surface reflectance of the window WM may be reduced.

The first layer LRL may be formed by an ion-assisted deposition process. As described above, the first layer LRL may be formed of magnesium oxide, magnesium fluoride, and/or yttrium oxyfluoride. In the process of forming the first layer LRL, each of magnesium oxide, magnesium fluoride, and/or yttrium oxyfluoride may be deposited in the form of particles on the surface of the base layer BL. Ionized argon (Ar) gas or oxygen ($O_2$) gas may be provided together during the deposition process, so that adhesion of a deposition film to the surface of the base layer BL may be improved. In another embodiment, the first layer LRL may be formed of a single material of magnesium fluoride, and magnesium fluoride may be deposited in the form of particles on the surface of the base layer BL. Ionized argon (Ar) gas or oxygen ($O_2$) gas may be provided together during the deposition process, so that adhesion of a deposition film to the surface of the base layer BL may be improved.

The first layer LRL may have a single layer structure formed of a single material. As described above, the first layer LRL may be a single layer formed of magnesium fluoride or a single layer formed of a solid solution in which magnesium oxide, magnesium fluoride, and yttrium oxyfluoride are mixed. For example, the first layer LRL may not include multiple layers.

The second layer ML may be disposed on the first layer LRL, and may be a layer for improving adhesion between the first layer LRL and the third layer FL. The second layer ML may be an adhesion promoter layer that has excellent adhesion to each of the first layer LRL and the third layer FL, and thus improve interlayer adhesion between the first layer LRL and the third layer FL. The second layer ML may be directly disposed on the first layer LRL.

The second layer ML may include a material having low refractive properties, excellent mechanical strength, and improved adhesion. The second layer ML may include a second material, and the second material may include a material having a lower refractive index than a material included in the base layer BL. For example, the second material included in the second layer ML may include silica, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof. For example, the second material may include silica ($SiO_2$), magnesium oxide (MgO), aluminum oxide ($Al_2O_3$), or any combination thereof.

In an embodiment, the second layer ML may include magnesium oxide (MgO). The second layer ML may further include silicon dioxide ($SiO_2$) in addition to magnesium oxide. The second layer ML may include a solid solution having a structure in which magnesium oxide is included. For example, the second layer ML may include a solid solution in which magnesium oxide and silicon dioxide are mixed. As the second layer ML includes the solid solution containing magnesium oxide, adhesion of the second layer ML to the first layer LRL including magnesium oxide may be improved. Like the first layer LRL, the second layer ML may be formed by an ion-assisted deposition process.

In another embodiment, the second layer ML may include a solid solution including aluminum oxide and silicon dioxide. For example, the second layer ML may include a solid solution in which aluminum oxide and silicon dioxide are mixed. For example, the second material included in the second layer ML may have a solid solution structure including $Si_9Al_2O_{10}$.

For example, the second layer ML may have a thickness d3 of about 5 nm to about 25 nm. In case that the second layer ML has a thickness d3 less than about 5 nm, the effect of improving the adhesion between the first layer LRL and the third layer FL may not be achieved, and the mechanical strength of the window WM may be lowered. In case that the second layer ML has a thickness d3 of greater than about 25 nm, the reflectance of the window WM may increase, and the total thickness of the window WM may increase so that the overall thickness of the display device may be excessively increased.

The second layer ML may have a refractive index in a range of about 1.3 to about 1.6 at a wavelength of about 550 nm. In the window WM according to an embodiment, the second layer ML may have a refractive index in a range of about 1.45 to about 1.50 at a wavelength of about 550 nm. In case that the refractive index of the second layer ML at a wavelength of about 550 nm satisfies the above range, the surface reflectance of the window WM may be reduced.

The second layer ML may have a single layer structure formed of a single material. As described above, the second layer ML may be a single layer formed of a solid solution in which magnesium oxide and silicon dioxide are mixed, or a single layer formed of a solid solution in which aluminum oxide and silicon dioxide are mixed. For example, the second layer ML may not include multiple layers.

The third layer FL may be disposed on the second layer ML, and may be a layer that improves slip properties and scratch resistance of the surface of the window WM. In an embodiment, the third layer FL may be an anti-fingerprint layer that has excellent anti-fingerprint properties and reduces surface abrasion. The third layer FL may be directly disposed on the second layer ML. The third layer FL may be disposed on an uppermost layer of the window WM, and an upper surface of the third layer FL may define an uppermost surface of the window WM.

The third layer FL may include a material having excellent scratch resistance, slip properties, and low refractive properties. In an embodiment, the third layer FL may include a fluorine-containing polymer. For example, the third layer FL may include a perfluoropolyether (PFPE) compound. The third layer FL may include perfluoropolyether silane, perfluoroalkylether alkoxysilane, perfluoroalkylether copolymer, or the like. As the third layer FL includes the perfluoropolyether compound, the anti-fingerprint and scratch resistance of the third layer FL may be improved.

For example, the third layer FL may have a thickness d4 of about 5 nm to about 30 nm. In case that the third layer FL has a thickness d4 of less than about 5 nm, the anti-fingerprint and scratch resistance of the window WM may be reduced. In case that the third layer FL has a thickness d4 of greater than about 30 nm, the reflectance of the window WM may increase, and the total thickness of the window WM may increase, thereby excessively increasing the overall thickness of the display device.

The third layer FL may have a refractive index in a range of about 1.3 to about 1.5 at a wavelength of about 550 nm. In the window WM according to an embodiment, the third layer FL may have a refractive index in a range of about 1.30 to about 1.35 at a wavelength of about 550 nm. In case that the refractive index of the third layer FL at a wavelength of about 550 nm satisfies the above range, the surface reflectance of the window WM may be reduced.

The total thickness (d2+d3+d4) of the first layer LRL, the second layer ML, and the third layer FL which are disposed on the base layer BL may be less than or equal to about 150 nm. In the window WM according to an embodiment, the total thickness (d2+d3+d4) of the first layer LRL, the second layer ML, and the third layer FL which are disposed on the base layer BL of the window WM may be set to less than or equal to about 150 nm, thereby making it possible to achieve the window WM having low reflection characteristics and excellent abrasion resistance and hardness.

In the window WM according to an embodiment, the reflectance of the surface of the window WM at a wavelength of about 550 nm may be less than or equal to about 6.5%. The third layer FL may be disposed on the uppermost layer of the window WM according to an embodiment, and the reflectance of the upper surface of the third layer FL at a wavelength of about 550 nm may be less than or equal to about 6.5%. The reflectance of the upper surface of the third layer FL at a wavelength of about 550 nm may be about 5.5% to about 6.0%. In this specification, the wording "reflectance" of the window WM is defined as a ratio of light reflected to the outside to the light incident from the outside toward the window WM. Light reflected to the outside may include both specular reflected light reflecting at the same angle as the incident light, and diffused reflected light reflecting in multiple directions. For example, in this specification, the reflectance is defined as specular component included (SCI) reflectance.

Referring to FIG. 4B, the window WM-1 according to an embodiment may include a fourth layer SML disposed between the base layer BL and the first layer LRL.

The fourth layer SML may be disposed on the base layer BL, and may be a layer for improving adhesion between the base layer BL and the first layer LRL. The fourth layer SML may be an adhesion promoter layer that has excellent adhesion to each of the base layer BL and the first layer LRL, and thus improve interlayer adhesion between the base layer BL and the first layer LRL. The fourth layer SML may be directly disposed on the base layer BL. The fourth layer SML may contact the base layer BL and the first layer LRL.

The fourth layer SML may include a material having low refractive properties, excellent mechanical strength, and improving adhesion. In an embodiment, the fourth layer SML may include magnesium oxide (MgO). The fourth layer SML may further include silicon dioxide ($SiO_2$) in addition to magnesium oxide. The fourth layer SML may include a solid solution having a structure in which magnesium oxide is included. For example, the fourth layer SML may include a solid solution in which magnesium oxide and silicon dioxide are mixed. As the fourth layer SML includes the solid solution including magnesium oxide, adhesion of the fourth layer SML to the first layer LRL including magnesium oxide may be improved. Like the first layer LRL, the fourth layer SML may be formed by an ion-assisted deposition process.

For example, the fourth layer SML may have a thickness of about 5 nm to about 25 nm. In case that the fourth layer SML has a thickness of less than about 5 nm, the effect of improving the adhesion between the base layer BL and the first layer LRL may not be achieved. In case that the fourth layer SML has a thickness of greater than about 25 nm, the reflectance of the window WM-1 may increase, and the total thickness of the window WM-1 may increase so that the overall thickness of the display device may be excessively increased.

The fourth layer SML may have a refractive index in a range of about 1.3 to about 1.6 at a wavelength of about 550 nm. In the window WM-1 according to an embodiment, the fourth layer SML may have a refractive index in a range of about 1.45 to about 1.50 at a wavelength of about 550 nm. In case that the refractive index of the fourth layer SML at a wavelength of about 550 nm satisfies the above range, the surface reflectance of the window WM-1 may be reduced.

Referring to FIGS. 1B, 3, 4A, and 4B, compared to the display device in which the anti-reflection layer includes a polarizing layer, the display device DD according to an embodiment in which the anti-reflection layer 300 included in the display module DM includes multiple color filters 320 may have an improved display efficiency but may have an increased reflectance. In the display device DD according to an embodiment of disclosure, the window WM may include the first layer LRL, the second layer ML, and the third layer FL, each including a material having a low refractive index, the surface reflectance of the window WM may be lowered. Accordingly, even if the anti-reflection layer 300 of the display module DM includes multiple color filters 320, the overall reflectance of the display device DD may be maintained to be low.

In the window WM according to an embodiment of the disclosure, while each of the first layer LRL, the second layer ML, and the third layer FL includes a low refractive index material, the second layer ML may include magnesium oxide (MgO). Since the second layer ML includes a solid solution including magnesium oxide, adhesion of the second layer ML to the first layer LRL including magnesium oxide may be improved, and thus the abrasion resistance of the window WM may be improved. The window WM according to an embodiment ensures the low refractive properties and also have improved abrasion resistance properties and mechanical strength because the window WM includes the structure of a first layer LRL and a second layer ML each being provided as a single layer, and each of the first layer LRL and the second layer ML includes a solid solution having a structure in which magnesium oxide is included. Accordingly, the durability of the display device DD including the window WM may be improved.

Figure 4C:
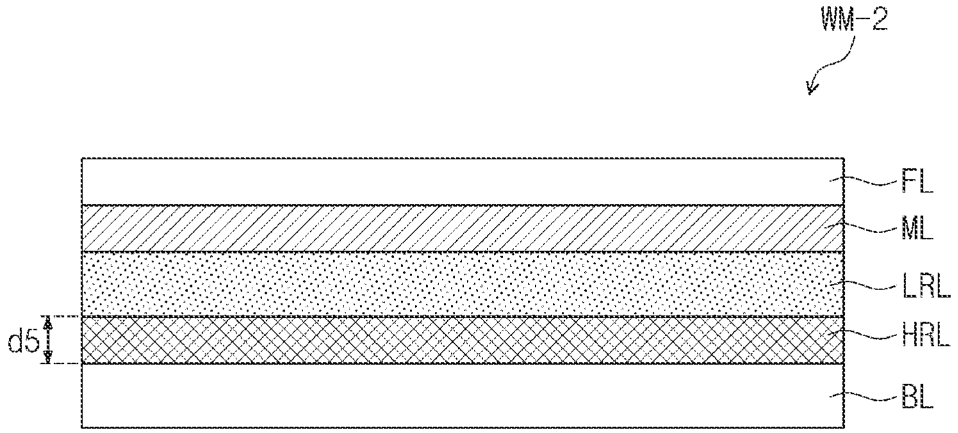
FIG. 4C is a schematic cross-sectional view of a window according to an embodiment.

Referring to FIG. 4C, the window WM-2 according to an embodiment may include a fifth layer HRL disposed between the base layer BL and the first layer LRL. The fifth layer HRL may have a high refractive index. In the window WM-2 according to an embodiment, the fifth layer HRL may have a refractive index in a range of about 1.7 to about 3.0 at a wavelength of about 550 nm. The fifth layer HRL may have a refractive index in a range of about 2.0 to about 2.5 at a wavelength of about 550 nm. The fifth layer HRL may have a refractive index of about 2.33 at a wavelength of about 550 nm. The fifth layer HRL may have excellent adhesion to each of the base layer BL and the first layer LRL.

The fifth layer HRL may be disposed on the base layer BL and may have a high refractive index, so that the surface reflectance of the window WM-2 may be further reduced. The window WM-2 according to an embodiment may have a structure in which a first layer LRL, a second layer ML, and a third layer FL having a low refractive index are sequentially stacked on a fifth layer HRL having high refractive properties, thereby reducing the surface reflectance of the window WM-2. Since, the fifth layer HRL may have excellent adhesion to each of the base layer BL and the first layer LRL, interlayer adhesion between the base layer BL and first layer LRL may be maintained for a long time. The fifth layer HRL may be disposed directly on the base layer BL. The fifth layer HRL may contact the base layer BL and the first layer LRL.

The fifth layer HRL may include a material having high refractive properties, excellent mechanical strength, and improved adhesion. In an embodiment, the fifth layer may include zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), oxide tungsten ($WO_3$), aluminum nitride (AlN), or any combination thereof.

For example, the fifth layer HRL may include niobium oxide ($Nb_2O_5$). As the fifth layer HRL includes niobium oxide ($Nb_2O_5$) or the like, the fifth layer HRL may have a high refractive index in the above-described range, and may also have excellent adhesion to each of the base layer BL and the first layer LRL in contact with the fifth layer HRL. Like the first layer LRL, the fifth layer HRL may be formed by an ion-assisted deposition process. In the process of forming the fifth layer HRL, a high refractive material such as zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), oxide tungsten ($WO_3$), and aluminum nitride (AlN) may be deposited in the form of particles on the surface of the base layer BL. Ionized oxygen ($O_2$) gas may be provided together during the deposition process, so that the adhesion of the deposition film to the surface of the base layer BL may be improved.

The fifth layer HRL may have a thickness d5 of about 5 nm to about 25 nm. For example, the fifth layer HRL may have a thickness d5 of about 10 nm. In case that the fifth layer HRL has a thickness d5 of less than about 5 nm, the reflectance of the window WM-2 may increase, and the effect of improving adhesion between the base layer BL and the first layer LRL may not be achieved. In case that the fifth layer HRL has a thickness d5 of more than about 25 nm, the total thickness of the window WM-2 may be increase, and thus the overall thickness of the display device may be excessively increased.

In the window WM-2 according to an embodiment, the reflectance of the surface of the window WM-2 at a wavelength of about 550 nm may be less than or equal to about 5.0%. The third layer FL may be disposed on the uppermost layer of the window WM-2 according to an embodiment, and the upper surface of the third layer FL may have a reflectance of less than or equal to about 5.0% at a wavelength of about 550 nm. The third layer FL may have a reflectance of about 4.0% to about 4.5% at a wavelength of about 550 nm. As the window WM-2 according to an embodiment of the disclosure further include a fifth layer HRL provided between the first layer LRL and the base layer BL, the window WM-2 may have a lower surface reflectance compared to a case in which the first layer LRL is disposed directly on the base layer BL. For example, in the window WM-2 according to an embodiment of the disclosure, a fifth layer HRL having a high refractive index may be provided between the base layer BL and the first layer LRL, and the window WM-2 may have a structure in which a high refractive layer and a low refractive layer are sequentially disposed on the base layer BL. Through this, the window WM-2 may implement a structure that further reduces the surface reflectance of the window WM-2. Since the fifth layer HRL included in the window WM-2 may be formed by depositing a material such as niobium oxide ($Nb_2O_5$) on the upper surface of the base layer BL by an ion-assisted deposition process, the fifth layer HRL may have high adhesion to the base layer BL. Accordingly, the window WM-2 may have the same level of abrasion resistance as a window in which the fifth layer HRL is omitted. Accordingly, the display device including the window WM-2 may have excellent low reflection characteristics without deterioration in durability.

Figure 4D:
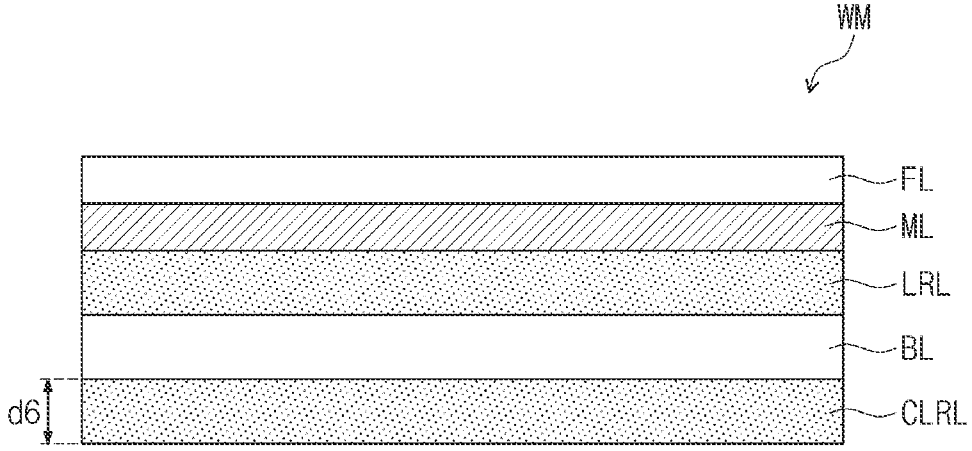
FIG. 4D is a schematic cross-sectional view of a window according to an embodiment.

Referring to FIG. 4D, the window WM-3 according to an embodiment may include a sixth layer CLRL disposed below the base layer BL. The sixth layer CLRL may have a low refractive index. In the window WM-3 according to an embodiment, the sixth layer CLRL may have a refractive index in a range of about 1.3 to about 1.5 at a wavelength of about 550 nm. The sixth layer CLRL may have a refractive index in a range of about 1.38 to about 1.40 at a wavelength of about 550 nm.

The sixth layer CLRL may be disposed below the base layer BL and may have a low refractive index, so that the surface reflectance of the window WM-3 may be further reduced. As the window WM-3 according to an embodiment further includes a sixth layer CLRL disposed below the base layer BL, the window WM-3 may have a better reflective color than a window that does not include the sixth layer CLRL. The sixth layer CLRL may be disposed below the base layer BL and may be spaced apart from the first layer LRL with the base layer BL therebetween. For example, in case that the window WM-3 according to an embodiment is applied to the display device DD (see FIG. 2), the sixth layer CLRL may be disposed adjacent to the display module DM (see FIG. 2) compared to the base layer BL, the first layer LRL, the second layer ML, and the third layer FL. The sixth layer CLRL may be disposed directly below the base layer BL. The sixth layer CLRL may be in contact with the lower surface of the base layer BL.

The sixth layer CLRL may include a material having a low refractive index and excellent adhesion to the base layer BL. The sixth layer CLRL may include a first material like the first layer LRL, and as described above, the first material may include a material having a lower refractive index than that of the material included in the base layer BL. For example, the first material included in the sixth layer CLRL may include silica, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or any combination thereof. For example, the sixth layer CLRL may include at least one of magnesium fluoride ($MgF_2$) and magnesium oxide (MgO) as a first material.

In an embodiment, the sixth layer CLRL may include magnesium oxide (MgO). The sixth layer CLRL may further include magnesium fluoride ($MgF_2$) and yttrium oxyfluoride (YOF) in addition to magnesium oxide. The sixth layer CLRL may include a solid solution having a structure in which magnesium oxide is included. For example, the sixth layer CLRL may include a solid solution in which magnesium oxide, magnesium fluoride, and yttrium oxyfluoride are mixed. In another embodiment, the sixth layer CLRL may include magnesium fluoride ($MgF_2$). The sixth layer CLRL may be a single layer made of magnesium fluoride ($MgF_2$).

The sixth layer CLRL and the first layer LRL may include a same material or different materials. For example, each of the first layer LRL and the sixth layer CLRL may include magnesium fluoride. Each of the first layer LRL and the sixth layer CLRL may include a solid solution in which magnesium oxide, magnesium fluoride, and yttrium oxyfluoride are mixed. In another embodiment, one of the first layer LRL or the sixth layer CLRL may include magnesium fluoride, and another one may include a solid solution in which magnesium oxide, magnesium fluoride, and yttrium oxyfluoride are mixed.

Like the first layer LRL, the sixth layer CLRL may be formed by an ion-assisted deposition process. In the process of forming the sixth layer CLRL, at least one of materials such as magnesium oxide, magnesium fluoride, and yttrium oxyfluoride may be deposited in the form of particles on the surface of the base layer BL. Ionized argon (Ar) gas or oxygen ($O_2$) gas may be provided together during the deposition process, so that adhesion of a deposition film to the surface of the base layer BL may be improved.

For example, the sixth layer CLRL may have a thickness d6 of about 50 nm to about 130 nm. In case that the sixth layer CLRL has a thickness d6 of less than about 50 nm, the surface reflectance of the window WM-3 may not be sufficiently reduced. In case that the sixth layer CLRL has a thickness d6 greater than about 130 nm, the mechanical strength of the window WM-3 may decrease and thus the durability of the window may be deteriorated, and the total thickness of the window WM-3 may increase to excessively increase the overall thickness of the display device.

In the window WM-3 according to an embodiment, the surface of the window WM-3 may have a reflectance of less than or equal to about 5.0% at a wavelength of about 550 nm. The third layer FL may be disposed on the uppermost layer of the window WM-3 according to an embodiment, and the upper surface of the third layer FL may have the reflectance of less than or equal to about 5.0% at a wavelength of about 550 nm. The upper surface of the third layer FL may have a reflectance of about 1.3% to about 4.5% at a wavelength of about 550 nm. As the window WM-3 according to an embodiment of the disclosure further include the sixth layer CLRL provided below the base layer BL, the window WM-3 may have a lower surface reflectance compared to a case in which there is no separate layer disposed under the base layer BL. For example, the window WM-3 according to an embodiment of the disclosure may have a structure in which the first layer LRL and the sixth layer CLRL having low refractive properties are respectively provided on both surfaces of the base layer BL, thereby implementing a structure that further reduces the surface reflectance of the window WM-3. Accordingly, the display device including the window WM-3 may have excellent low reflection characteristics.

According to an embodiment of the disclosure, a window may include a first layer and a third layer having a low refractive index and a second layer having excellent adhesion, thereby improving abrasion resistance and mechanical strength. Accordingly, a display device including a window may have improved durability.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A window comprising:
- a base layer comprising a glass substrate or a polymer film;
- a first layer disposed on the base layer;
- a second layer disposed on the first layer; and
- a third layer disposed on the second layer, wherein
- the second layer comprises silica ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or a combination thereof, the first layer has a refractive index in a range of about 1.3 to about 1.5 at a wavelength of about 550 nm,
- the second layer has a refractive index in a range of about 1.3 to about 1.6 at a wavelength of about 550 nm, and
- the third layer has a refractive index in a range of about 1.3 to about 1.5 at a wavelength of about 550 nm.

2. The window of claim 1, wherein the second layer comprises silica ($SiO_2$), magnesium oxide (MgO), aluminum oxide ($Al_2O_3$), or a combination thereof.

3. The window of claim 1, wherein
- the second layer is disposed directly on the first layer, and
- the third layer is disposed directly on the second layer.

4. The window of claim 1, wherein the first layer comprises magnesium fluoride ($MgF_2$), magnesium oxide (MgO), or a combination thereof.

5. The window of claim 4, wherein the first layer further comprises yttrium oxyfluoride (YOF).

6. The window of claim 5, wherein the first layer comprises a solid solution in which magnesium oxide, magnesium fluoride, and yttrium oxyfluoride are mixed.

7. The window of claim 1, wherein the window has, at an upper surface of the third layer, a reflectance less than or equal to about 6.5% at a wavelength of about 550 nm.

8. The window of claim 1, wherein the third layer comprises a fluorine-containing polymer.

9. The window of claim 1, wherein
- the first layer has a thickness in a range of about 50 nm to about 130 nm,
- the second layer has a thickness in a range of about 5 nm to about 25 nm, and the third layer has a thickness in a range of about 5 nm to about 30 nm.

10. The window of claim 1, further comprising:

a fourth layer disposed between the base layer and the first layer and including magnesium oxide.

11. The window of claim 1, further comprising:

a fifth layer disposed between the base layer and the first layer, wherein the fifth layer has a refractive index in a range of about 1.7 to about 3.0 at a wavelength of about 550 nm.

12. The window of claim 11, wherein the fifth layer comprises zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), oxide tungsten ($WO_3$), aluminum nitride (AlN), or a combination thereof.

13. The window of claim 1, further comprising:

a sixth layer disposed below the base layer, wherein the sixth layer has a refractive index in a range of about 1.3 to about 1.5 at a wavelength of about 550 nm.

14. The window of claim 13, wherein the sixth layer comprises magnesium oxide, magnesium fluoride, yttrium oxyfluoride, or a combination thereof.

15. A window comprising:

a base layer comprising a glass substrate or a polymer film;

a first layer disposed on the base layer;

a second layer disposed on the first layer; and a third layer disposed on the second layer, wherein the first layer comprises a first material, the second layer comprises a second material, the first material and the second material each independently include silica ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or a combination thereof, the first layer has a refractive index in a range of about 1.3 to about 1.5 at a wavelength of about 550 nm, and the third layer has a refractive index in a range of about 1.3 to about 1.5 at a wavelength of about 550 nm.

16. A display device comprising:

a display module; and a window disposed on the display module, wherein the window comprises:

a base layer;

a first layer disposed on the base layer;

a second layer disposed on the first layer; and a third layer disposed on the second layer, the second layer includes silica ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), magnesium oxide (MgO), or a combination thereof, and the second layer has a refractive index in a range of about 1.3 to about 1.6 at a wavelength of about 550 nm.

17. The display device of claim 16, wherein the display module comprises:

a circuit layer disposed on a base substrate;

a light-emitting element layer disposed on the circuit layer;

an encapsulation layer disposed on the light-emitting element layer; and an anti-reflection layer disposed on the encapsulation layer, and the anti-reflection layer includes:

a division layer including a plurality of division openings respectively overlapping a plurality of light-emitting elements in a thickness direction of the base substrate; and a plurality of color filters disposed to respectively correspond to the plurality of division openings.

18. The display device of claim 16, wherein the base layer is disposed between the first layer and the display module.

* * * * *